(12) United States Patent
Hughes et al.

(10) Patent No.: US 7,639,009 B2
(45) Date of Patent: Dec. 29, 2009

(54) 3D MR IMAGING WITH FAT SUPPRESSION

(75) Inventors: Timothy Hughes, Erlangen (DE); Bernd Kuehn, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 185 days.

(21) Appl. No.: 11/962,792

(22) Filed: Dec. 21, 2007

(65) Prior Publication Data

US 2008/0150531 A1 Jun. 26, 2008

(30) Foreign Application Priority Data

Dec. 22, 2006 (DE) .................. 10 2006 061 177

(51) Int. Cl.
*G01V 3/00* (2006.01)
(52) U.S. Cl. ..................................... 324/309
(58) Field of Classification Search ......... 324/300–322; 600/410–435
See application file for complete search history.

(56) References Cited

U.S. PATENT DOCUMENTS

| 4,818,941 A | | 4/1989 | McKinnon | |
|---|---|---|---|---|
| 5,614,827 A | * | 3/1997 | Heid | ............ 324/320 |
| 6,091,242 A | | 7/2000 | Hanawa | |
| 6,888,349 B2 | | 5/2005 | Fautz | |
| 7,251,520 B2 | * | 7/2007 | Shankaranarayanan et al. | ............ 600/415 |
| 7,323,871 B2 | * | 1/2008 | Foo | ............ 324/307 |
| 7,411,397 B2 | * | 8/2008 | Shankaranarayanan et al. | ............ 324/309 |
| 2005/0017717 A1 | | 1/2005 | Duerk | |
| 2005/0070785 A1 | * | 3/2005 | Ahluwalia et al. | ............ 600/410 |

FOREIGN PATENT DOCUMENTS

JP 2002 204789 7/2002

OTHER PUBLICATIONS

Patent Abstract of Japan Publication No. 2006 000265 A, Date of Publication Jan. 15, 2006.
Fast and Precise $T_1$ Imaging Using a TOMROP Sequence Sequence, Brix, et al. Magnetic Resonance in Imaging, vol. 8 (1990) pp. 351-356.

* cited by examiner

*Primary Examiner*—Brij B Shrivastav
*Assistant Examiner*—Dixomara Vargas
(74) *Attorney, Agent, or Firm*—Schiff Hardin LLP

(57) ABSTRACT

In a method for image generation by magnetic resonance with suppression of a spectral component of the magnetic resonance signal during the signal acquisition, k-space is sampled in sub-sections, an excitation pulse for excitation of the spectral component to be suppressed is radiated at a point in time TI before acquisition of each sub-section of k-space, and different TI values are selected for the respective sub-sections.

13 Claims, 4 Drawing Sheets

3D MR IMAGING WITH FAT SUPPRESSION

BACKGROUND OF THE INVENTION

1. Field of the Invention

The present invention concerns a method for image generation by magnetic resonance, of the type wherein a spectral component of the magnetic resonance signal should be suppressed in the signal acquisition.

2. Description of the Prior Art

In the acquisition of MR images the human body, due to their concentration only the hydrogen nuclei of free water and in fat bonds respectively contribute to the MR signal. Their relative resonance frequency difference is approximately 3.4 ppm (parts per million). In many applications in MR imaging, it is desirable to suppress the fat signal contribution or signal contributions of other spin portions as well. For example, in order to suppress the interfering influence of the fat signal contribution it is known to suppress the spectral component of fat by what is known as a fat saturation or an inversion technique. In this technique a frequency-selective radio-frequency pulse (RF pulse) is used in order to saturate or to invert the fat signal portions before the image generation is begun with the actual signal acquisition. Such fat suppression pulses are applied each time before the actual MR imaging. In the case of fast imaging sequences this can mean that such fat saturation pulses are radiated into the examined body in a relatively fast sequence, for example within a few tens of milliseconds, with the point in time until the repetition of the next fat saturation pulse being on the order of, or smaller than, the T1 relaxation time of the fat signals. This leads to an equilibrium state of the fat signal portions. The application of a few RF pulses is typically required in order to reach this equilibrium state. Strong fluctuations in the fat magnetization can occur before this equilibrium state is reached. This means that, for example, the fat signals are not precisely inverted by 180° given a 180° inversion pulse.

At high basic magnetic field strengths of B1, the problem furthermore exists that the field strength of the radiated radio-frequency field for saturation of the fat signal portions is very inhomogeneous. This leads to the situation that the signal portions to be inverted experience different flip angles. This has the result that, in the signal acquisition for image generation, the fat signal contributions still undesirably contribute with varying strength to the detected signal, and thus to the signal intensity.

For a three-dimensional gradient echo sequence, the optimal point in time at which the fat suppression pulse should be radiated can be calculated using the sequence parameters such as repetition time, flip angle of the fat suppression, flip angle of the gradient echo sequence, etc. (see also Gunar Brix et al. in "Fast and Precise $T_1$ Imaging Using a Tomrop Sequence" in Magnetic Resonance Imaging, Vol. 8, pages 351-356, 1990). However, this point in time TI, that defines the point in time of the RF pulse before the actual MR signal acquisition ensues, depends strongly on the excitation angle of the 3D gradient echo sequence. This optimal point in time TI for the fat suppression is shown in FIG. 1 as a function of the excitation flip angle. FIG. 1 shows the change of the point in time TI for various excitation angles of the water protons in the actual imaging. As can be seen in FIG. 1, the point in time TI varies strongly for various angles. A long TI time is required for small flip angles while the TI time should be shortened for larger flip angles in order to obtain an optimal fat suppression.

Since, as mentioned above, the radiated B1 field for excitation can be inhomogeneous at high basic magnetic field strengths B0, this leads to an inhomogeneous fat suppression. Even if a type of pulse known as a non-B1-sensitive adiabatic RF pulse is used for the fat suppression, this leads to an inhomogeneous fat suppression since the non-sensitive B1 field excitation is not possible in the actual imaging sequence. This leads to the situation that the optimal point in time for fat suppression differs for different regions of the examined tissue. The use of adiabatic excitation pulses in the imaging sequence itself would lead to unacceptable SAR (specific absorption rate) values, such that too much power would be radiated into the examination region. Furthermore, an adiabatic excitation pulse would dramatically extend the temporal length of the excitation pulse, which would have a negative effect on the acquisition time.

SUMMARY OF THE INVENTION

Under the aforementioned circumstances, it is an object of the present invention to achieve MR imaging in which the influence of different contributions (portions) of spectral components (such as of the fat) is reduced.

This object is achieved according to the invention by a method for image generation by magnetic resonance (or at least for generating a k-space dataset that is made available for generating an MR image therefrom) in which a spectral component of the magnetic resonance signal such as, for example, the fat signal is suppressed during the signal acquisition. According to a first step of the invention, k-space is sampled in sub-sections. K-space is what is known as the spatial frequency space or raw data space that is filled with data in the signal acquisition. The actual MR image is then acquired by a subsequent Fourier transformation of k-space. In the image generation an excitation pulse for excitation of the spectral component to be suppressed is switched (radiated) at a point in time TI before the acquisition of each sub-section of k-space in order to suppress the unwanted spectral component before the actual signal acquisition. According to one aspect of the invention, different TI times are selected for the respective sub-sections of k-space. This means that the point in time TI for suppression of a predetermined spectral component for the various sub-sections of k-space is not constant, but rather is varied. When k-space is now sampled in sub-sections with varying points in time TI, the point in time at which the RF pulses are applied for suppression of a spectral component varies. This means that a different weighting of the spectral component to be suppressed exists in the various respective sub-sections of k-space. In the reconstructed MR image, this means that overall the signal portion of the spectral component to be suppressed is blurred or smeared. In the MR image this provides a more homogeneous distribution of the unwanted spectral components, which overall means a more homogeneous distribution of the unwanted signal portions.

According to a further aspect of the invention, k-space is sampled in sub-sections such that the k-space center is acquired at different TI times. The k-space center is the region of the raw data space around $k_x=k_y=k_z=0$, i.e. in proximity to $k_x=k_y=k_z=0$. Those signals that are acquired in the k-space center are responsible for the image contrast while the outer k-space region is responsible for the resolution in the image. Different TI times for the image contrast result by sampling of the k-space center at different TI times, such that overall a blurred contrast of the suppressed spectral component results, which leads to a better contrast and a reduced influence of the signal to be suppressed on the image contrast.

According to an embodiment of the invention, the individual sub-sections of k-space are read out radially from the center region outward. The radial readout of the k-space sections ensures that the different sub-sections each contain a section of the k-space center. Thus, it is achieved that the k-space center is read out at different TI times. If k-space were to be divided such that a single sub-section covered the k-space center, the TI time belonging to this section would be responsible for the signal portion of the component to be suppressed, since the signals of the k-space center are responsible for the signal intensity. By using a radial readout, it is achieved that different points in time TI contribute to the contrast of the component to be suppressed.

The TI times between the various sub-sections of k-space can be varied such that a distribution of the TI times around an average value $TI_m$ results. This average value $TI_m$ can be selected, for example dependent on the imaging parameters that are used for the actual image generation after the suppression of the spectral component. This leads to sections within k-space that have slightly different signal portions of the spectral component being suppressed. One possibility of the distribution of the TI times around the value $TI_m$ is a linear distribution. A different distribution of the TI times around the average value $TI_m$ is also possible. For example, the distribution of the TI times can be selected dependent on the B1 field distribution that is used for excitation of the magnetic resonance signal in the imaging sequence. The B1 distribution is the field distribution of the radio-frequency pulse that deflects the magnetization from the equilibrium position by the flip angle α.

The spectral component to be suppressed is advantageously the fat signal, but it is possible to also use the present invention for suppression of other spectral components in the magnetic resonance signal.

According to an exemplary embodiment, the sub-sections of k-space can be fashioned as circle segments, with the circle segments respectively proceeding through the center point of the circle. In this exemplary embodiment, k-space to be acquired in total is divided up into pie slice-like sub-sections, with each sub-section contains a region of the k-space center. Other divisions of k-space are naturally also possible. Other radially symmetrical sub-divisions of k-space are possible, for example a helical readout of k-space. With knowledge of the excitation angle of the actual imaging sequence, it is possible to determine the correct TI value from FIG. 1, and to read out k-space such that the k-space center in a sub-section is read out with a TI value that corresponds to the calculated TI value from FIG. 1. The subsequent excitations for the other sub-sections are then advantageously selected such that they lie symmetrically around the calculated TI value.

For actual image generation, a three-dimensional gradient echo sequence is advantageously used. In the present invention three-dimensional does not mean that a number of slices with a predetermined slice thickness are measured in series, since in this case the resolution in the direction of the slice thickness is typically much poorer than in the plane. In the present context, three-dimensional data sets mean data sets with approximately isotropic resolution in all three spatial directions. For this purpose, the individual slices are not selectively excited and measured in series; rather, an excitation of an entire volume ensues with a resolution of the third dimension via an additional phase coding gradient. The radial acquisition of k-space preferably ensues in the two phase coding directions while the signal readout of k-space ensues in the third direction orthogonal thereto.

The invention is particularly suited for use in MR systems with basic magnetic field strengths B0 with high field strengths (such as, for example, 2 to 3 Tesla). At these high basic field strengths the chemical shift in the signal between contributions of water and of fat intensifies, such that fat signal contributions increasingly negatively influence the imaging. This negative influencing can be reduced with the inventive method, particularly at high field strengths.

The individual sub-sections of k-space are acquired in a temporal segment TR. In a preferred embodiment TR is kept constant from the acquisition of one sub-section to the acquisition of the next sub-section. As mentioned above, according to the invention the point in time TI varies for the various sub-sections. According to an embodiment it is now possible to linearly alter the point in time TI, which means that the time interval from saturation pulse to the actual signal acquisition changes linearly. Other forms of modification of the point in time TI are naturally also possible. According to a different embodiment, for example, with knowledge of the B1 field distribution it is possible to select the variation of the point in time TI dependent on the known B1 field distribution.

The readout or acquisition of k-space typically ensues at a point in time TI, with the k-space center being read out at the beginning and each sub-section of k-space being acquired radially proceeding outward. In another embodiment, it is possible to sample the sub-sections of k-space such that again the k-space center is acquired first. It is now possible to sample a sub-section such that the available time is further used so that regions of a k-space section are already sampled in the time span before the point in time TI. The method thus can proceed such that the other regions of each sub-section are acquired before and after the point in time TI.

DESCRIPTION OF THE PREFERRED EMBODIMENTS

Figure 1:
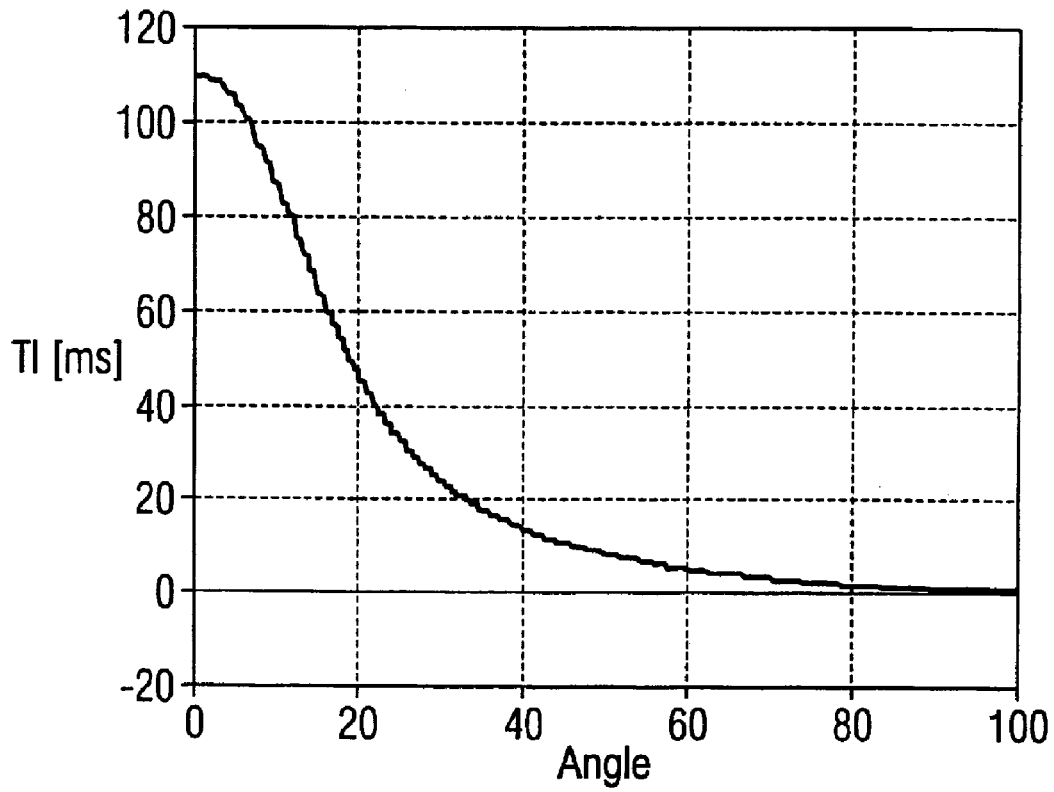
FIG. 1 shows the dependency of the point in time TI given radiation of a saturation pulse before the image generation dependent on the flip angle α that is used in the excitation.
Figure 2:
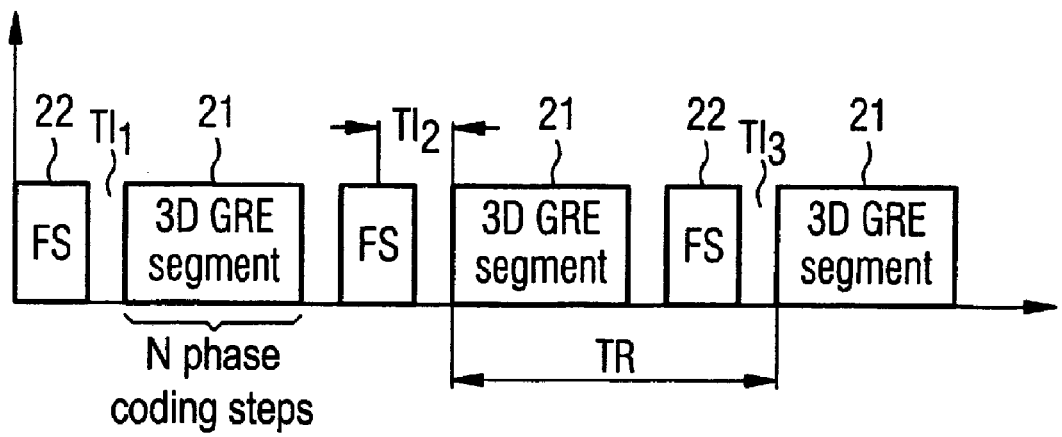
FIG. 2 schematically illustrates the temporal sequence of the inventive method for fat saturation for a 3D gradient echo sequence.

As discussed above, the optimal point in time for the fat suppression before the signal readout depends on the flip angle that is used in the three-dimensional gradient echo sequence. In order to reduce different signal intensities due to the fat signal portion, the method as shown in FIG. 2 is proposed. Given a three-dimensional gradient echo sequence for image generation, k-space is subdivided into sub-sections. As shown in FIG. 2, various sub-sections 21 are used in order to fill k-space with raw data. N-phase coding steps are respectively implemented in each sub-section. A fat suppression module 22 is now selected before the measurement of each sub-section 21. The point in time TI is defined as the point in time of the application of the fat suppression segment with switching of the RF pulse relative to the beginning of the actual signal acquisition in a sub-section 21. In the example shown in FIG. 2, the time TR from one sub-section to the next sub-section is constant. From FIG. 2 it now follows that a fat suppression pulse is switched before respective N-phase coding steps that belong to a sub-section. The point in time TI is now inventively non-constant, meaning that the values for $TI_1$, $TI_2$ and $TI_3$ shown in FIG. 2 are not equal. Rather, the TI times vary. For example, it is possible to effect a linear variation of the TI times. This means that the point in time for application of the fat suppression pulse changes linearly before readout of the respective N-phase coding steps. The flip angle α used in the three-dimensional gradient echo sequence is known, such that the theoretically optimal TI time can be calculated via the graph from FIG. 1. According to one embodiment the TI times can now be selected such that they are selected linearly longer or shorter than the optimal TI time.

Figure 3:
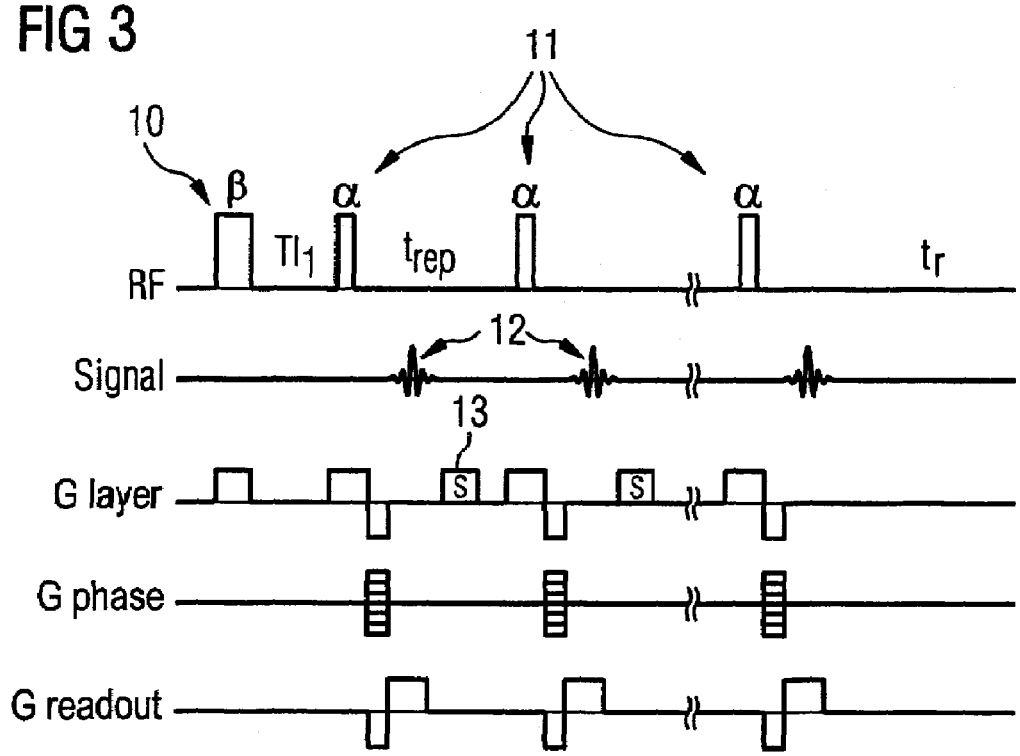
FIG. 3 shows a pulse sequence for MR image data acquisition according to the invention with suppression of a spectral component.

The sequence diagram upon readout of a three-dimensional section is shown in FIG. 3. For excitation of the fat signal to be suppressed, a β pulse 10 is radiated (that, in the present case, is a 180° pulse (π pulse)) in order to invert the fat signal portions. After the inversion pulse the actual image acquisition ensues after the time span TI1 with the switching of a plurality of α pulses 11, with the gradient G slice, G phase and G readout being switched as is typical for a gradient echo sequence. The repetition time $t_{rep}$ specifies the time span between two α pulses. This means that the signals 12 are induced via bipolar switching of the readout gradient. A spoiler gradient 13 for destruction of the residual magnetization ensues before the next α pulse. The equilibrium state of the fat signal population now depends on the repetition time between two α pulses. If this repetition time is long relative to the T1 time of the fat, the equilibrium state is then dominated by the excitation pulse. However, given a three-dimensional gradient echo sequence the application of a β pulse 10 ensues every 5 to 10 ms, such that this time interval is no longer large relative to the T1 time of fat. The influence of the repetition time of the β pulses on the equilibrium state is consequently intensified.

Figure 4:
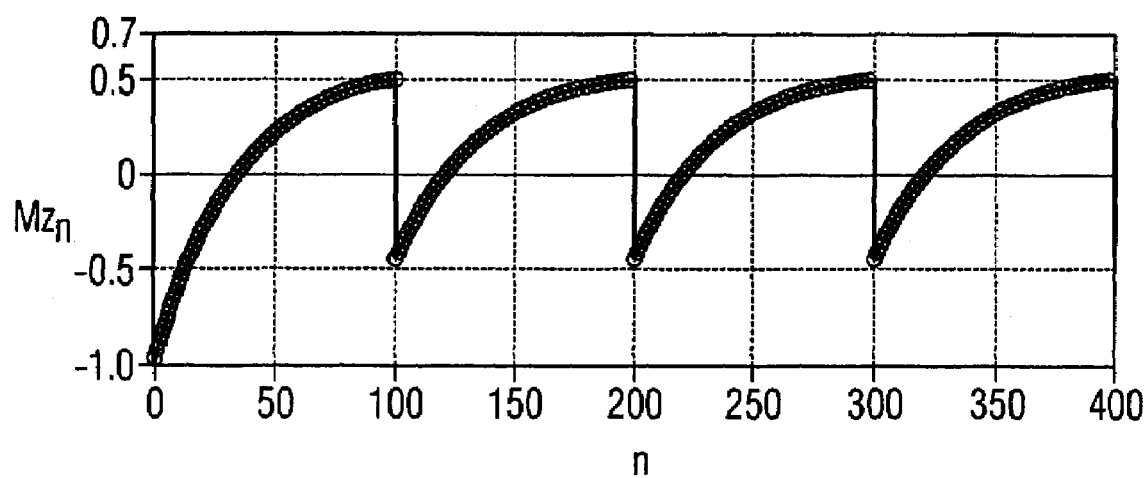
FIG. 4 shows the development of the magnetization in the case of the sequence of FIG. 3.

The behavior of the magnetization Mz of the fat contributions is exemplarily shown in FIG. 4 for a sequence in which the repetition time for the β pulses is approximately 500 ms, as well as 5 ms for the α pulses. In FIG. 4 the magnetization is shown after a 180° pulse, where it can be seen that it does not entirely return to its equilibrium state. The magnetization value Q immediately before the first α pulse is provided by the following equation:

$$Q = \frac{Mz_{ss}(\alpha, t_{rep}, T1) \cdot \cos(\alpha) \cdot \cos(\beta) \cdot E_r \cdot E_{TI1} \cdot |1-(\cos(\alpha) \cdot E_{trepeat})^{N-1}|}{1-\cos(\alpha) \cdot \cos(\beta) \cdot E_r \cdot E_{TI1} \cdot (\cos(\alpha) \cdot E_{trepeat})^{N-1}} + \frac{\cos(\beta) \cdot E_{TI1} \cdot (1-E_r) - E_{TI1} + 1}{1-\cos(\alpha) \cdot \cos(\beta) \cdot E_r \cdot E_{TI1} \cdot (\cos(\alpha) \cdot E_{trepeat})^{N-1}}, \quad (1)$$

wherein $E_{TI1} = e^{-TI1/T1}$ and $E_{trepeat} = e^{-trepeat/T1}$ and $E_r = e^{-tr/T1}$.

M0 is the magnetization before radiation of an α pulse, $Mz_{ss}$ is the equilibrium magnetization and Q is the quotient of the magnetization shortly before the application of the inversion pulse and the equilibrium magnetization. All remaining parameters are shown in FIG. 1. N is hereby the number of the excitation pulses. Typically a wait is implemented until the Mz magnetization of the fat signal portions is 0 before the actual signal readout is begun. Applied to the above equation (1), this means that Q=0. The TI value for the zero crossing of the fat component of the fat portion after the 180° pulse can therewith be calculated according to the following:

$$TI_{zero} = -\ln\left(\frac{-1}{\begin{array}{l}Mz_{ss}(\alpha, t_{rep}, T1) \cdot \cos(\alpha) \cdot \cos(\beta) \cdot \\ E_r \cdot [1-(\cos(\alpha) \cdot E_{trepeat})^{N-1}] + \\ \cos(\beta) \cdot (1-E_r) - 1\end{array}}\right) \cdot T1 \quad (2)$$

A value of $TI_{zero}$ of 115 ms, which is in good agreement with the values shown in FIG. 4, results for the sequence shown in FIG. 4 and with the number of the pulses after $TI_{zero}$=80. For the case that the excitation pulses α are already applied before $TI_{zero}$, a slightly different approach must be used for calculation. It can be shown that the magnetization $M_n$ after an equilibrium state relaxes with an effective time constant $T_{eff}$ is represented by the following equation:

$$\tau_{eff} = \frac{Trepeat}{\ln(\cos(\beta)) - \frac{Trepeat}{T1}} \quad (3)$$

With this assumption it is then possible to calculate $TI_{zero}$ using the following equation:

$$TI_{zero} = \ln(0.5) \cdot \tau_{eff} \quad (4)$$

As shown in FIGS. 3 and 4, it is possible to calculate the optimal TI value dependent on the imaging parameters of the three-dimensional gradient echo sequence.

Figure 5:
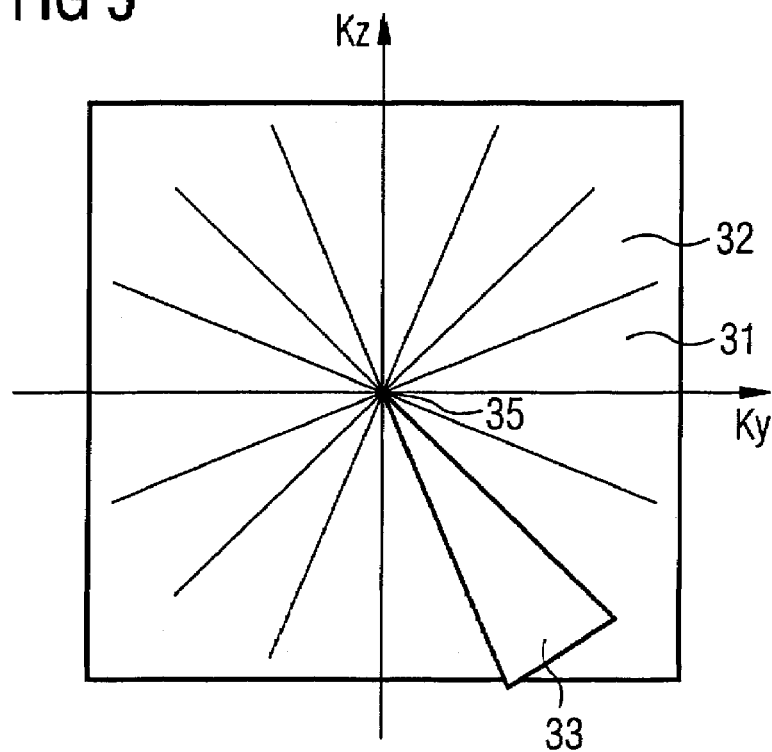
FIG. 5 shows the division of k-space into sub-sections according to a first embodiment.

In FIG. 5 a possibility is shown as to how three-dimensional k-space can be divided into various sub-sections. K-space is shown in the two phase coding direction $K_y$ and $K_z$ in FIG. 3; the signal readout ensues in a direction parallel to $K_x$. The signal readout ensues as in FIGS. 2 and 3. In the embodiment shown in FIG. 5 k-space is sub-divided into what are known as pie slices. Three different pie slices 31, 32 and 33 are shown in FIG. 5 that respectively correspond to a sub-section 21 from FIG. 2. A saturation pulse for saturation of the fat signal portions is respectively switched before readout of a pie slice 31, 32 or 33 and a k-space section 31, 32 or 33 is subsequently read out after expiration of TI. This point in time TI is now varied for the various sub-sections. As is to be recognized in FIG. 3, the sub-sections 31, 32 and 33 are aligned radially relative to the k-space center point 35. The k-space center is the region around the k-space center point 35. The division of k-space shown in FIG. 5 ensures that the region around the k-space center point 35 is acquired at various TI times. These various TI times lead to different signal intensity portions of the fat signal to be suppressed. Since the k-space center is responsible for the contrast, while the outer k-space region determines the resolution of the MR images, the division shown in FIG. 5 enables a more homogeneous contrast overall in the generated MR image. The fat signal portion is "smeared".

Figure 6:
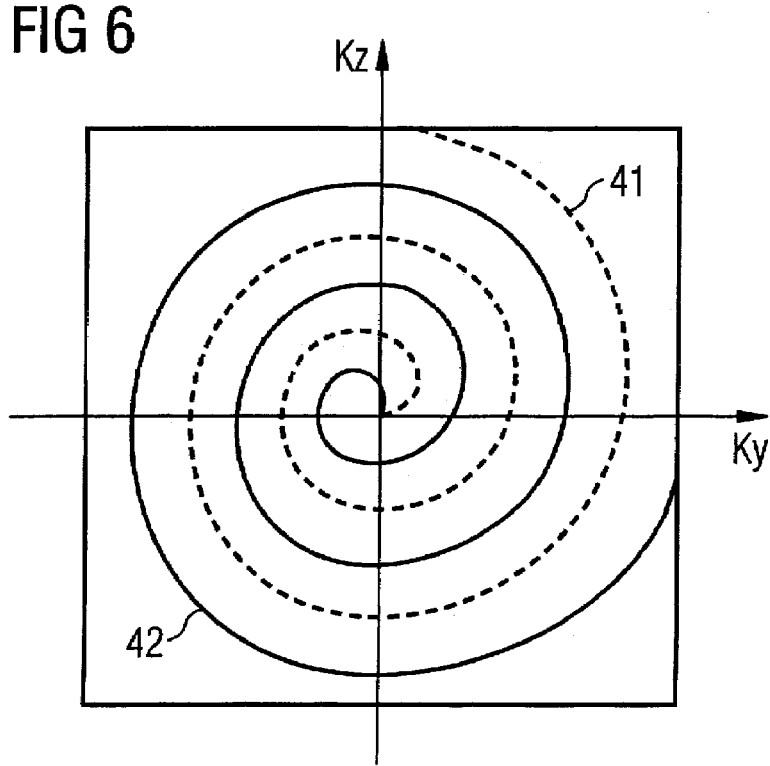
FIG. 6 shows the division of k-space into sub-sections according to a second embodiment.

A further example of a radially symmetrical readout of k-space is shown in FIG. 6. In the exemplary embodiment shown in FIG. 6 the k-space sections are fashioned helically. A first sub-section represented by the dashed line 41. A further sub-section is represented by the solid line 42. The sub-section 41 is read out with the first TI time while the sub-section 42 is read out with a different TI time. The signal readout again ensues in the $K_x$ direction parallel to the $K_x$-axis. Given the division of k-space into segments that is represented in FIG. 5, it is again achieved that the k-space center is covered by various sub-sections that are read out at various TI times. The same effect as in FIG. 5 is thereby achieved, namely a "smearing" of the signal intensity of the fat signal, which leads to a more homogeneous image contrast overall.

Other radial divisions of k-space in which the k-space center is read out in various sub-sections are naturally conceivable.

Figure 7A:
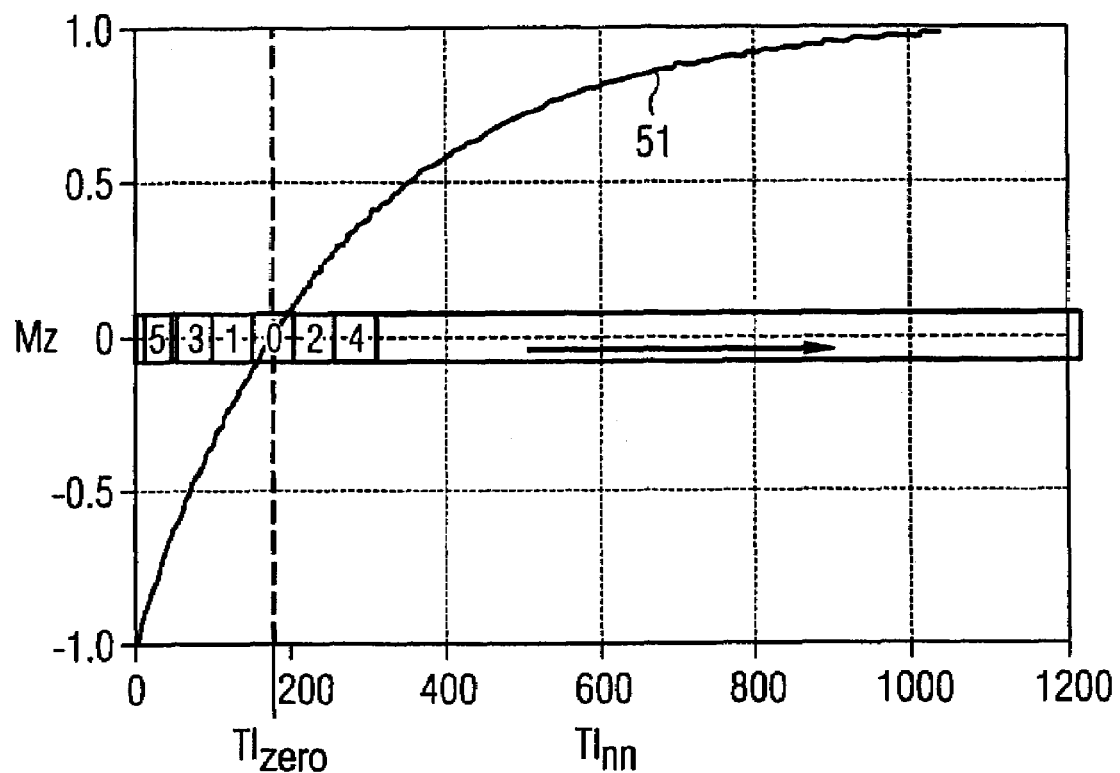
FIGS. 7a and 7b illustrate another acquisition scheme for a sub-section of k-space.
Figure 7B:
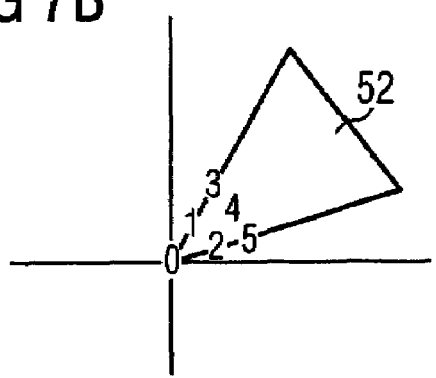

Another acquisition scheme is shown in FIGS. 7a and 7b. FIG. 7a shows the magnetization 51 of the fat signal portions after a 180° pulse. This has a component Mz=0 given a predetermined TI value (=$TI_{zero}$). In the embodiments discussed above the signal readout was begun after the zero crossing of the magnetization since at this point in time no Z-component of the magnetization can be excited by the following α pulse. As in the previous embodiments, the k-space center (which is represented in FIG. 7b with zero) is read out first. In the previous embodiments the sub-sections would then have been read out in the order 1 2 3 4 5 after the zero (see FIG. 7b). The embodiment shown in FIG. 7a differs from the previous embodiments only in that it is no longer waited until the point in time TI before the actual imaging sequences (the α pulses) are begun. In order to reasonably utilize the available time of the entire acquisition, sub-regions of the k-space section 52 are already read out before the value $TI_{zero}$, namely in the order 5 3 1 0 2 4 as it is shown in FIG. 7a in comparison to the embodiments described above, in which the sections 0 1 2 3 4 5 were read out in the order 0 1 2 3 4 5 beginning at the point in time $TI_{zero}$.

In summary, by the sampling of k-space with different TI times and with a radial trajectory, the signal influence of the spectral component to be suppressed is reduced in the image.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating a magnetic resonance data set from which an image of an examination subject can be produced, comprising the steps of:
    exposing an examination subject to a magnetic resonance data acquisition pulse sequence including acquiring a magnetic resonance signal from the examination subject, said magnetic resonance signal comprising multiple signal components and representing raw magnetic resonance data and, in said pulse sequence, activating an excitation pulse for excitation of a selected spectral component to be suppressed;
    dividing k-space into a plurality of sub-sections and entering said raw data into k-space respectively in said sub-sections;
    in said pulse sequence, activating said excitation pulse for said selected spectral component at a point in time T1 before entering said raw data into each of said sub-sections of k-space, with T1 being different for the respective sub-sections; and
    making k-space, in which said raw magnetic resonance data has been entered, available in a form suitable for generating a magnetic resonance image of the examination subject therefrom.

2. A method as claimed in claim 1 wherein k-space comprises a center region, and comprising dividing k-space into said sub-sections to cause respective portions of said center region to be contained in respectively different sub-sections, so that said raw data are entered into the respective portions of said center region for respective sub-sections associated with different points in time T1.

3. A method as claimed in claim 1 comprising selecting the respective points in time T1 for the respective sub-sections to produce a distribution of points in time T1 around an average value that is selected dependent on parameters associated with said pulse sequence.

4. A method as claimed in claim 1 comprising entering said raw data into the respective sub-sections of k-space along a trajectory proceeding radially outwardly from a center of k-space.

5. A method as claimed in claim 1 wherein k-space has a center, and wherein the step of dividing k-space into a plurality of sub-sections comprises dividing k-space into a plurality of segments of a circle, each segment including said k-space center.

6. A method as claimed in claim 1 comprising, in said pulse sequence, reading out said magnetic resonance signal with a three-dimensional gradient echo sequence.

7. A method as claimed in claim 6 wherein said three-dimensional radiant echo sequence comprises two phase coding directions, and comprising entering said raw data into k-space radially in each of said phase coding directions.

8. A method as claimed in claim 1 comprising exposing said examination subject to a static basic magnetic field of greater than 1.5 T tesla while exposing said examination subject to said pulse sequence.

9. A method as claimed in claim 1 wherein said magnetic resonance signal comprises a fat signal component, and selecting said fat signal component as said signal component to be suppressed.

10. A method as claimed in claim 1 comprising maintaining constant a time between entering said raw data into successive ones of said sub-sections of k-space.

11. A method as claimed in claim 1 comprising changing said point in time T1 linearly for the respective sub-sections of k-space.

12. A method as claimed in claim 1 comprising exciting said magnetic resonance signal in said examination subject by irradiating the examination subject with a radio frequency field having a field distribution associated therewith, and comprising varying said points in time T1 to produce a distribution of points in time T1 around an average value that is selected dependent on said field distribution.

13. A method as claimed in claim 1 wherein k-space has a center region and comprising dividing k-space into said plurality of sub-sections so that each of said sub-sections contains a portion of said center region, and entering said raw data into the respective portions of said center region in the respective sub-sections at said respective points in time T1, and entering raw data into other portions of each sub-section before and after the point in time T1 associated with that respective sub-section.

* * * * *